(12) United States Patent
Han et al.

(10) Patent No.: US 10,374,123 B2
(45) Date of Patent: Aug. 6, 2019

(54) UV LIGHT EMITTING DEVICE (71) Applicant: SEOUL VIOSYS CO., LTD., Ansan-si (KR)

(72) Inventors: Chang Seok Han, Ansan-si (KR); Woo Chul Kwak, Ansan-si (KR); Hyo Shik Choi, Ansan-si (KR); Jung Hwan Hwang, Ansan-si (KR); Chang Geun Jang, Ansan-si (KR)

(73) Assignee: SEOUL VIOSYS CO., LTD., Ansan-si (KR)

( * ) Notice: Subject to any disclaimer, the term of this patent is extended or adjusted under 35 U.S.C. 154(b) by 0 days.

(21) Appl. No.: 15/563,526

(22) PCT Filed: Mar. 28, 2016

(86) PCT No.: PCT/KR2016/003149
§ 371 (c)(1),
(2) Date: Sep. 29, 2017

(87) PCT Pub. No.: WO2016/159614
PCT Pub. Date: Oct. 6, 2016

(65) Prior Publication Data
US 2018/0090640 A1    Mar. 29, 2018

(30) Foreign Application Priority Data
Mar. 31, 2015 (KR) .................. 10-2015-0045557

(51) Int. Cl.
*H01L 33/12* (2010.01)
*H01L 33/00* (2010.01)
(Continued)

(52) U.S. Cl.
CPC ............ *H01L 33/12* (2013.01); *H01L 33/007* (2013.01); *H01L 33/0079* (2013.01);
(Continued)

(58) Field of Classification Search
CPC ....................................................... H01L 33/12
See application file for complete search history.

(56) References Cited

U.S. PATENT DOCUMENTS

| | | | | |
|---|---|---|---|---|
| 2010/0187496 A1* | 7/2010 | Yan | ......................... | H01L 33/12 257/13 |
| 2011/0064103 A1* | 3/2011 | Ohta | ...................... | B82Y 20/00 372/45.01 |

(Continued)

FOREIGN PATENT DOCUMENTS

| | | |
|---|---|---|
| CN | 1434996 A | 8/2003 |
| JP | 09-148678 A | 6/1997 |

(Continued)

OTHER PUBLICATIONS

International Search Report and Written Opinion in International Application No. PCT/KR2016/003149, dated Jun. 27, 2016.

(Continued)

*Primary Examiner* — Lex H Malsawma
*Assistant Examiner* — Xia L Cross
(74) *Attorney, Agent, or Firm* — Perkins Coie LLP (57) ABSTRACT

Disclosed herein is a UV light emitting device. The UV light emitting device includes a first conductive type semi-conductor layer, an anti-cracking layer disposed on the first conductive type semiconductor layer, an active layer disposed on the anti-cracking layer, and a second conductive type semiconductor layer disposed on the active layer, wherein the anti-cracking layer includes first lattice points and second lattice points disposed at an interface between the first conductive type semiconductor layer and the anti-cracking layer, the first lattice points are connected to lattices of the first conductive type semiconductor layer, and the second lattice points are not connected to the lattices of the first conductive type semiconductor layer.

13 Claims, 6 Drawing Sheets (51) Int. Cl.
 H01L 33/32 (2010.01)
 H01L 33/06 (2010.01)
 H01L 33/22 (2010.01)
(52) U.S. Cl.
 CPC ............. *H01L 33/06* (2013.01); *H01L 33/22* (2013.01); *H01L 33/32* (2013.01)

(56) References Cited

U.S. PATENT DOCUMENTS

2011/0163349 A1* 7/2011 Sakai .................. H01L 21/0237
 257/99
2013/0146917 A1* 6/2013 Chinone ................ H01L 33/46
 257/98
2015/0083994 A1* 3/2015 Jain ..................... H01L 33/0025
 257/13

FOREIGN PATENT DOCUMENTS

| JP | 11-121798 A | 4/1999 |
| JP | 11-121799 A | 4/1999 |
| JP | 200317744 A | 1/2003 |
| JP | 2004281553 A | 10/2004 |
| JP | 2010263163 A | 11/2010 |
| JP | 2012160608 A | 8/2012 |
| JP | 2013122943 A | 6/2013 |
| JP | 2013-149938 A | 8/2013 |
| JP | 2013-187428 A | 9/2013 |
| JP | 2015-026770 A | 2/2015 |
| KR | 10-2012-0079393 A | 7/2012 |
| KR | 10-2014-0090801 A | 7/2014 |

OTHER PUBLICATIONS

Office Action dated Jul. 31, 2018 in Japanese Patent Application No. 2017-551155, 2 pages English translation.
Office Action dated Sep. 29, 2018 in Chinese Patent Application No. 201680020506.6, 10 pages with English translation.
Supplementary European Search Report from EP16773395 dated Sep. 25, 2018, 13 pages.
Young et al. "Compositionally graded relaxed AlGaN buffers on semipolar GaN for mid-ultraviolet emission" Applied Physics Letters 101, 142109-1 through 142109-5 (2012).
Haeger et al. "384 nm laser diode grown on a (2021) semipolar relaxed AlGaN buffer layer" Applied Physics Letters 100, 161107-1 through 161107-1 (2012).

* cited by examiner

UV LIGHT EMITTING DEVICE

TECHNICAL FIELD

Exemplary embodiments of the present disclosure relate to an ultraviolet (UV) light emitting device, and more particularly, to a UV light emitting device including an anti-cracking layer capable of preventing generation of cracks to improve crystallinity of semiconductor layers.

BACKGROUND ART

Since a UV light emitting device emits light having a relatively short peak wavelength (generally, a peak wavelength of 400 nm or less), a light emitting region is formed of AlGaN containing 10% or more of Al in fabrication of a UV light emitting device using a nitride semiconductor. In such a UV light emitting device, if n-type and p-type nitride semiconductor layers have smaller energy band-gaps than energy of UV light emitted from an active layer, UV light emitted from the active layer can be absorbed into the n-type and p-type nitride semiconductor layers in the light emitting device. Then, the light emitting device suffers from significant deterioration in luminous efficacy. Accordingly, not only the active layer of the UV light emitting device, but also other semiconductor layers placed in a light emitting direction of the UV light emitting device, particularly, an n-type semiconductor layer, contain 10% or more of Al.

In fabrication of a UV light emitting device, a sapphire substrate is generally used as a growth substrate. However, when $Al_xGa_{(1-x)}N$ layer ($0.1 \leq x \leq 1$) containing 10% or more of Al is grown on the sapphire substrate, the UV light emitting device suffers from cracking or breaking caused by thermal or structural deformation due to a high Al content. This problem is caused by lattice mismatch or difference in coefficient of thermal expansion between the sapphire substrate and the $Al_xGa_{(1-x)}N$ layer ($0.1 \leq x \leq 1$). Specifically, due to difference in coefficient of thermal expansion between the sapphire substrate having a relatively high coefficient of thermal expansion and a nitride semiconductor having a relatively low coefficient of thermal expansion, a wafer suffers from bowing into a concave shape upon growth of the nitride semiconductor at high temperature (at about 1000° C. or more). When the growth temperature is decreased again, the wafer is flattened again or bowed into a convex shape. Due to bowing of the wafer, cracks are generated in the nitride semiconductor, thereby causing deterioration in production yield and quality of light emitting devices.

DISCLOSURE OF INVENTION

Technical Problem

Exemplary embodiments of the present disclosure provide a UV light emitting device that includes semiconductor layers having good crystallinity and has an anti-cracking structure.

Exemplary embodiments of the present disclosure provide a vertical-type UV light emitting device that includes semiconductor layers having good crystallinity

Solution to Problem

In accordance with aspects of the present disclosure, a UV light emitting device includes: a first conductive type semiconductor layer; an anti-cracking layer disposed on the first conductive type semiconductor layer; an active layer disposed on the anti-cracking layer; and a second conductive type semiconductor layer disposed on the active layer, wherein the anti-cracking layer includes first lattice points and second lattice points disposed at an interface between the first conductive type semiconductor layer and the anti-cracking layer, the first lattice points are connected to lattices of the first conductive type semiconductor layer, and the second lattice points are not connected to the lattices of the first conductive type semiconductor layer.

In accordance with various aspects of the present disclosure, a UV light emitting device includes: a first conductive type semiconductor layer; an anti-cracking layer disposed on the first conductive type semiconductor layer; an active layer disposed on the anti-cracking layer; and a second conductive type semiconductor layer disposed on the active layer, wherein a portion above an interface between the first conductive type semiconductor layer and the anti-cracking layer has a higher lattice density than a portion under the interface.

In accordance with various aspects of the present disclosure, a method of fabricating a UV light emitting device includes: forming a first conductive type semiconductor layer on a growth substrate; forming an anti-cracking layer on the first conductive type semiconductor layer; forming an active layer on the anti-cracking layer; and forming a second conductive type semiconductor layer on the active layer, wherein the anti-cracking layer is formed at a lower growth temperature than the first conductive type semiconductor layer, and the forming the anti-cracking layer includes forming first lattice points not connected to lattices of the first conductive type semiconductor layer.

Advantageous Effects of Invention

According to exemplary embodiments, a UV light emitting device includes an anti-cracking layer disposed on a first conductive type semiconductor layer to improve crystallinity of semiconductor layers, thereby improving reliability and efficiency of the UV light emitting device. In addition, according to exemplary embodiments, a method of fabricating a UV light emitting device includes forming an anti-cracking layer on a first conductive type semiconductor layer, thereby facilitating separation of a growth substrate from the first conductive type semiconductor layer.

BRIEF DESCRIPTION OF DRAWINGS

FIG. 9a to FIG. 10b are sectional views illustrating a method of forming an anti-cracking layer according to exemplary embodiments.

MODE FOR THE INVENTION

A UV light emitting device according to various exemplary embodiments and a method of fabricating the same can be realized in various ways.

A UV light emitting device according to some exemplary embodiments includes a first conductive type semiconductor layer; an anti-cracking layer disposed on the first conductive type semiconductor layer; an active layer disposed on the anti-cracking layer; and a second conductive type semiconductor layer disposed on the active layer, wherein the anti-cracking layer includes first lattice points and second lattice points disposed at an interface between the first conductive type semiconductor layer and the anti-cracking layer, the first lattice points are connected to lattices of the first conductive type semiconductor layer, and the second lattice points are not connected to the lattices of the first conductive type semiconductor layer.

At the interface between the first conductive type semiconductor layer and the anti-cracking layer, the anti-cracking layer can have a higher density of lattice points per unit area than the first conductive type semiconductor layer.

The first conductive type semiconductor layer can include a crack induction portion in which a lattice distance gradually increases in an upward direction.

A horizontal lattice distance in an uppermost portion of the crack induction portion can be greater than an average horizontal lattice distance in the first conductive type semiconductor layer.

At least some of the second lattice points can be placed on the crack induction portion.

The anti-cracking layer can include a plurality of layers, and at least one of the plurality of layers can include a lattice point not connected to a lattice in a layer under the at least one layer.

The plurality of layers of the anti-cracking layer can constitute a super lattice structure.

Each of the first conductive type semiconductor layer and the anti-cracking layer can include a nitride-based semiconductor including Al and Ga.

The anti-cracking layer can further include indium (In), the active layer can have a multi-quantum well structure including barrier layers and well layers, and the barrier layer can include a nitride-based semiconductor containing Al, Ga and In.

The light emitting device can further include a growth substrate disposed under the first conductive type semiconductor layer, wherein the growth substrate can have a higher coefficient of thermal expansion than the first conductive type semiconductor layer.

The UV light emitting device can further include a super lattice layer disposed between the anti-cracking layer and the active layer.

In some exemplary embodiments, the UV light emitting device can further include a first electrode disposed under the first conductive type semiconductor layer and electrically connected to the first conductive type semiconductor layer; and a second electrode disposed on an upper side of the second conductive type semiconductor layer and electrically connected to the second conductive type semiconductor layer.

The anti-cracking layer can have a thickness of 5 nm to 15 nm.

A UV light emitting device according to other exemplary embodiments includes: a first conductive type semiconductor layer; an anti-cracking layer disposed on the first conductive type semiconductor layer; an active layer disposed on the anti-cracking layer; and a second conductive type semiconductor layer disposed on the active layer, wherein a portion above an interface between the first conductive type semiconductor layer and the anti-cracking layer has a higher lattice density than a portion under the interface.

The anti-cracking layer can be grown at a lower growth temperature than the first conductive type semiconductor layer, and during growth of the anti-cracking layer, a lattice not connected to a lattice of the first conductive type semiconductor layer can be formed.

A method of fabricating a UV light emitting device according to other exemplary embodiment can include: forming a first conductive type semiconductor layer on a growth substrate; forming an anti-cracking layer on the first conductive type semi-conductor layer; forming an active layer on the anti-cracking layer; and forming a second conductive type semiconductor layer on the active layer, wherein the anti-cracking layer is formed at a lower growth temperature than the first conductive type semiconductor layer, and the forming the anti-cracking layer includes forming first lattice points not connected to lattices of the first conductive type semiconductor layer.

During the formation of the anti-cracking layer, an inner temperature of a growth chamber can be gradually decreased for at least some period of time.

The first conductive type semiconductor layer can be grown at a first temperature, the active layer can be grown at a second temperature lower than the first temperature, and the anti-cracking layer can be grown during lowering the temperature from the first temperature to the second temperature.

During lowering the temperature from the first temperature to the second temperature, a crack induction portion can be formed in the first conductive type semi-conductor layer, and first lattice points not connected to lattices of the first conductive type semiconductor layer of the anti-cracking layer can be formed in the crack induction portion.

The forming the anti-cracking layer can further include forming second lattice points connected to lattices of the first conductive type semiconductor layer.

The forming the anti-cracking layer can include growing the anti-cracking layer using remaining sources among sources introduced into a growth chamber to form the first conductive type semiconductor layer instead of introducing a separate source into the growth chamber during formation of the anti-cracking layer.

Hereinafter, exemplary embodiments of the present disclosure will be described in detail with reference to the accompanying drawings. The following embodiments are provided by way of example so as to fully convey the spirit of the present disclosure to those skilled in the art to which the present disclosure pertains. Accordingly, the present disclosure is not limited to the embodiments disclosed herein and can also be implemented in different forms. In the drawings, widths, lengths, thicknesses, and the like of elements can be exaggerated for clarity and descriptive purposes. It will be understood that when an element such as a layer, film, region or substrate is referred to as being "on" another element, it can be directly on the other element or intervening elements can also be present. In contrast, when an element is referred to as being "directly on" another element, there are no intervening elements present. Throughout the specification, like reference numerals denote like elements having the same or similar functions.

It should be understood that respective composition ratios, growth methods, growth conditions, and thicknesses of semiconductor layers described below are provided for illustration only and do not limit the scope of the present disclosure. For example, when a certain semiconductor layer is represented by AlGaN, a composition ratio of Al and Ga in the semiconductor layer can be determined in various ways as needed. Furthermore, semiconductor layers described below can be grown by various methods generally known to person having ordinary knowledge in the art (hereinafter, "those skilled in the art"), for example, metal organic chemical vapor deposition (MOCVD), molecular beam epitaxy (MBE), hydride vapor phase epitaxy (HVPE), and the like. In the following exemplary embodiments, semiconductor layers will be described as being grown in the same chamber by MOCVD. During growth of semiconductor layers, sources introduced into a chamber can be selected from sources known to those skilled in the art, for example, TMGa and TEGa as Ga sources, TMAl and TEAl as Al sources, TMIn and TEIn as In sources, and $NH_3$ as an N source, without being limited thereto, other implementations are also possible.

Although a method of fabricating a single UV light emitting device is described in the following exemplary embodiments, it should be understood that the present disclosure is not limited thereto. The following exemplary embodiments can also be applied to fabrication of a wafer for fabrication of a plurality of light emitting devices on a substrate having a size of several inches or more.

FIG. 1 to FIG. 7 are sectional views of a UV light emitting device according to exemplary embodiments and a method of fabricating the same. FIG. 1 to FIG. 7 sequentially illustrate the method of fabricating a light emitting device according to the exemplary embodiment. However, it should be understood that the method of fabricating the light emitting device according to this exemplary embodiment is not limited to the sequence described below. In addition, FIG. 8 is a graph illustrating a method of forming an anti-cracking layer according to one exemplary embodiment, FIG. 9a to FIG. 10b are sectional views of methods of forming anti-cracking layers according to exemplary embodiments, and FIG. 11a and FIG. 11b are enlarged sectional views of a relationship between a first conductive type semiconductor layer and each of anti-cracking layers according to exemplary embodiments.

Figure 1:
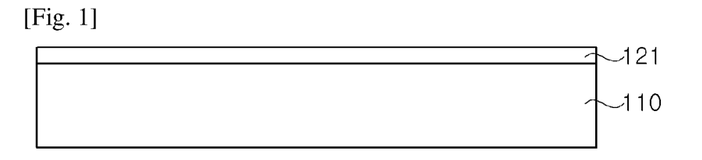
FIG. 1 to FIG. 7 are sectional views of a UV light emitting device according to exemplary embodiments and a method of fabricating the same.

Referring to FIG. 1, a growth substrate 110 is prepared. Furthermore, the fabrication method according to this exemplary embodiment can further include forming a buffer layer 121 on the growth substrate 110.

The growth substrate 110 can be selected from any substrates that allow growth of nitride semiconductor layers thereon, and can be, for example, a sapphire substrate, a silicon carbide substrate, a spinel substrate, or a nitride substrate such as a GaN substrate or an AlN substrate. Particularly, in this exemplary embodiment, the growth substrate 110 can be a sapphire substrate. Further, the growth substrate 110 according to this exemplary embodiment can have a lower coefficient of thermal expansion than nitride semiconductor layers formed by the following processes described below.

The buffer layer 121 can include Ga, for example, GaN. The buffer layer 121 can be grown to a thickness of about 25 nm or less on the growth substrate 110, and can be grown at a temperature of about 600° C. and a pressure of 600 Torr. Particularly, in an exemplary embodiment wherein the growth substrate 110 is a sapphire substrate, the buffer layer 121 can act as a nucleus layer so as to allow growth of other semi-conductor layers thereon, and can also serve to relieve stress due to a difference in lattice parameter between the sapphire substrate and other semiconductor layers formed thereon by the following processes. For example, the buffer layer 121 can include a 2D growth layer and a 3D growth layer. In this exemplary embodiment, the buffer layer 121 is formed of a nitride semiconductor including GaN, thereby further facilitating separation of the growth substrate through laser lift-off. In some exemplary embodiments, the buffer layer 121 can also be omitted, as needed.

Figure 2:
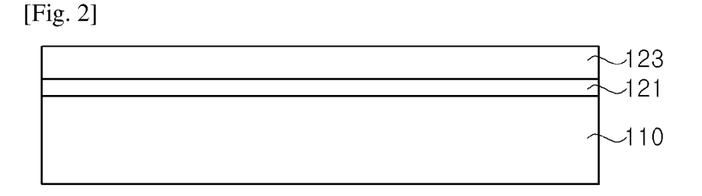

Then, referring to FIG. 2, a base nitride layer 123 is formed on the growth substrate 110.

The base nitride layer 123 can include Ga, and can include, for example, an undoped GaN layer. The base nitride layer 123 can be grown in a growth chamber into which a Ga source and an N source are introduced, at a temperature of about 900° C. to 1100° C. and a pressure of about 200 Torr. The base nitride layer 123 can be grown to a thickness of about 1 μm to 1.2 μm. Alternatively, the base nitride layer 123 can include an Al-containing nitride semiconductor. In this exemplary embodiment, the Al content can be adjusted to allow the base nitride layer 123 to absorb a laser beam in a laser lift-off process. For example, the base nitride layer 123 can contain about 40% or less of Al, preferably 20% or less of Al.

In the method of fabricating a light emitting device according to this exemplary embodiment, the base nitride layer 123 is grown on the growth substrate 110, and can absorb a laser beam emitted during a process of separating the growth substrate 110. Accordingly, the method of fabricating a light emitting device according to this exemplary embodiment allows easy separation of the growth substrate 110. In addition, GaN grown on the growth substrate 110 has a lower crystal defect density than AlN. Accordingly, the base nitride layer 123 including GaN having relatively good crystallinity is formed before growth of an n-type semiconductor layer, thereby improving overall crystallinity of the light emitting device, as compared with growth of an AlN layer before growth of the n-type semiconductor layer in the related art.

In some exemplary embodiments, the buffer layer 121 and/or the base nitride layer 123 can be omitted, as needed. For example, in fabrication of a horizontal type light emitting device, the base nitride layer 123 can be omitted.

Figure 3:
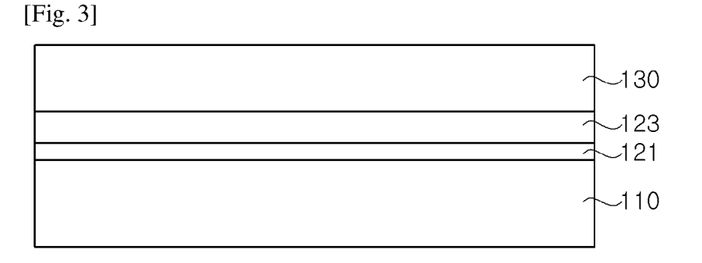

Then, referring to FIG. 3, a first conductive type semiconductor layer 130 is formed on the growth substrate 110, that is, on the base nitride layer 123.

The first conductive type semiconductor layer 130 can be grown by supplying group III element sources including an Al source, an N source, and a dopant source into the growth chamber. For example, the first conductive type semiconductor layer 130 can be grown by supplying TMAl and TMGa as the group III element sources, $NH_3$ as the N source, and silane as the dopant source into the growth chamber. In the growth chamber, the growth temperature can be set in the range of about 1050° C. to 1150° C. and although the growth pressure is not particularly limited, the growth pressure can be, for example, about 200 Torr. The first conductive type semiconductor layer 130 grown can include Si in a concentration of, for example, $1 \times 10^{18}$ $cm^{-1}$ or more, and thus exhibit n-type conductivity. Here, it should be understood that the dopant for the first conductive type semiconductor layer 130 is not limited to Si and can include various dopants such as Ge, C, Sn, and the like.

The first conductive type semiconductor layer 130 can be composed of a single layer or multiple layers. In an exemplary embodiment wherein the first conductive type semiconductor layer 130 is composed of multiple layers, the first conductive type semiconductor layer 130 can include a contact layer, a clad layer, and the like, and can further include a super lattice layer.

Figure 4:
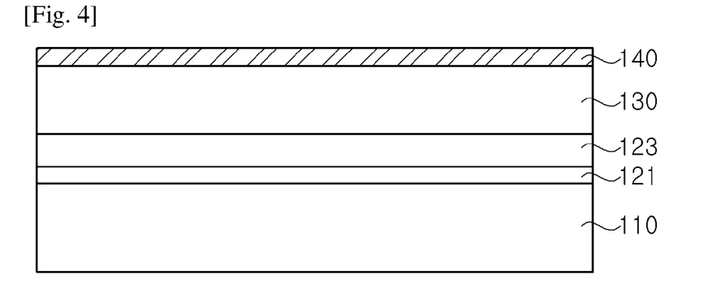
Figure 5:
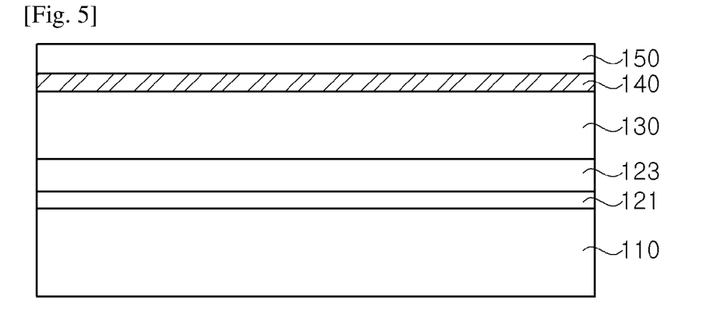

Referring to FIG. 4, an anti-cracking layer 140 is formed on the first conductive type semiconductor layer 130. Next, with reference to FIG. 8 to FIG. 11b, exemplary embodiments of the anti-cracking layer 140 will be described in detail. FIG. 8 is a graph illustrating a method of forming an anti-cracking layer 140 according to one exemplary embodiment; and FIG. 9a to FIG. 10b are sectional views illustrating a method of forming an anti-cracking layer 140 according to exemplary embodiments. In addition, FIG. 11a and FIG. 11b are enlarged sectional views of a relationship between the first conductive type semiconductor layer 130 and the anti-cracking layer 140 according to the exemplary embodiments, in which lattices of the first conductive type semiconductor layer 130 and the anti-cracking layer 140 are schematically shown.

Figure 8:
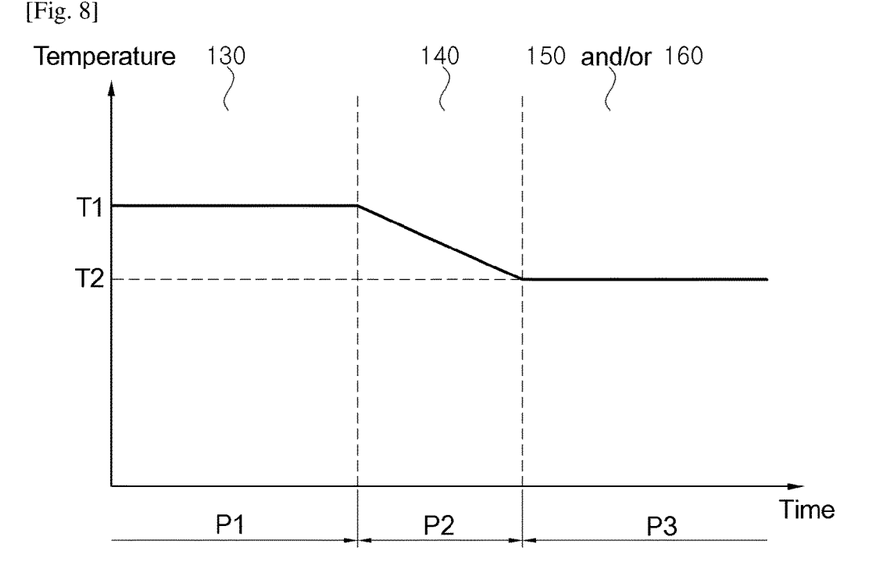
FIG. 8 is a graph illustrating a method of forming an anti-cracking layer according to exemplary embodiments.
Figure 9A:
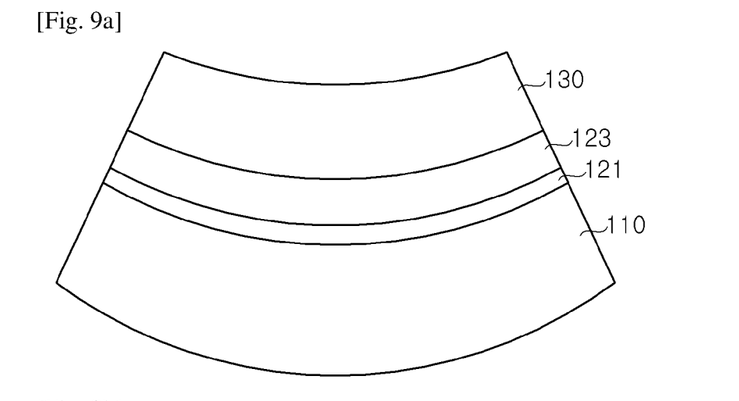
Figure 9B:
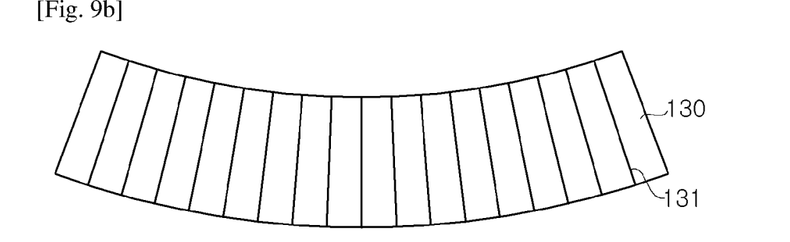

First, referring to FIG. 8, FIG. 9a and FIG. 9b, with the inner temperature of the growth chamber set to a first temperature T1, the first conductive type semiconductor layer 130 is grown for a first period of time P1. As described above, the first temperature T1 can be a temperature ranging from about 1050° C. to 1150° C., for example, about 1100° C. Further, the first conductive type semiconductor layer 130 can be grown by supplying group III element sources (for example, TMAl and TMGa), an N source (for example, $NH_3$) and a dopant source (for example, silane) into the growth chamber.

During growth of the first conductive type semiconductor layer 130, the wafer with the first conductive type semiconductor layer 130 grown on the growth substrate 110 is deformed into a concave shape, as shown in FIG. 9a. This deformation results from a difference in coefficient of thermal expansion between nitride semiconductor layers including the first conductive type semiconductor layer 130 and the growth substrate 110 which has a higher coefficient of thermal expansion than nitride semiconductor layers, as described above. Specifically, the growth temperature of the buffer layer 121 initially grown on the growth substrate 110 (for example, about 600° C.) is lower than the growth temperature of the first conductive type semiconductor layer 130. Accordingly, after growth of the buffer layer 121, when the inner temperature of the growth chamber is increased to a high temperature of about 1000° C. or more for growth of the first conductive type semiconductor layer 130, an expansion rate of the substrate becomes higher than the expansion rate of the nitride semiconductors, thereby causing deformation of the wafer into a concave shape, that is, a bowing phenomenon.

Here, some of lattices 131 in the first conductive type semiconductor layer 130 can be arranged as shown in FIG. 9b. In FIG. 9b, the lattices 131 are shown as being generally arranged in a direction parallel to a growth direction (that is, in a perpendicular direction with respect to a growth plane of the growth substrate 110) for convenience of description. Thus, the lattices of the first conductive type semiconductor layer 130 according to this exemplary embodiment are not limited thereto.

Figure 10A:
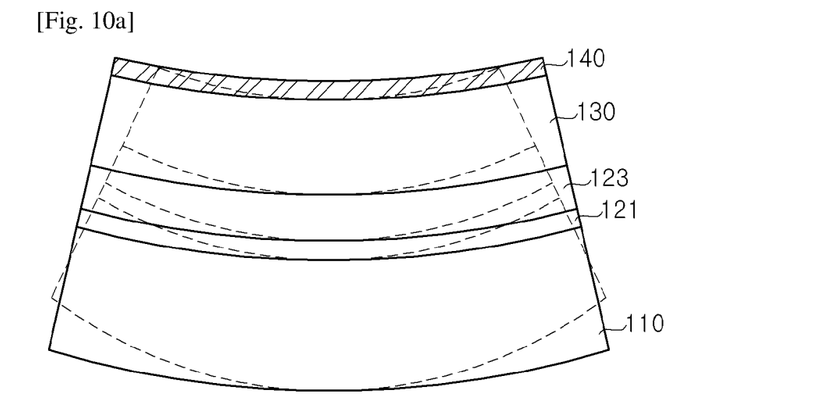
Figure 10B:
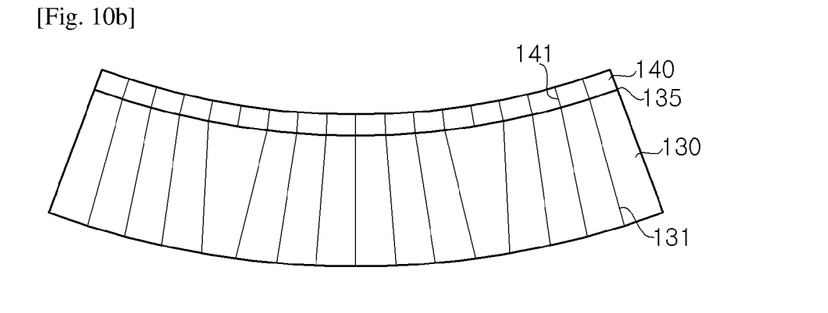
Figure 11A:
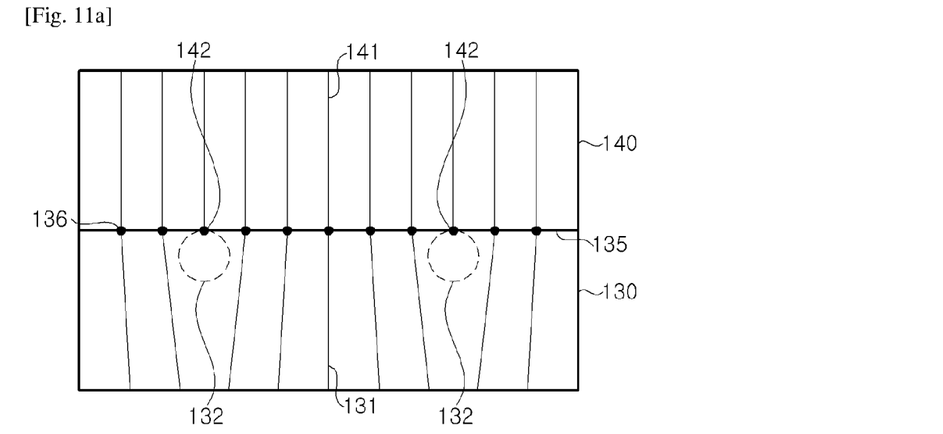
FIG. 11a and FIG. 11b are enlarged sectional views of a relationship between a first conductive type semiconductor layer and an anti-cracking layer according to exemplary embodiments.
Figure 11B:
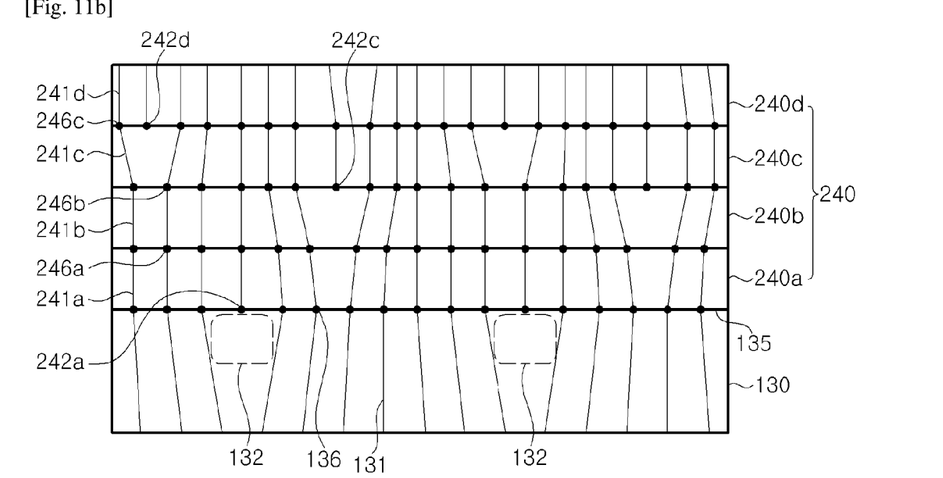

Next, referring to FIG. 8, FIG. 10a and FIG. 10b, the anti-cracking layer 140 is formed on the first conductive type semiconductor layer 130. The anti-cracking layer 140 can be formed at a lower temperature than the first conductive type semiconductor layer 130. In addition, the anti-cracking layer 140 can be grown in the course of decreasing the inner temperature of the growth chamber to grow a super lattice layer 150 or an active layer 160 on the first conductive type semiconductor layer 130. As shown in FIG. 8, after growth of the first conductive type semiconductor layer 130, the anti-cracking layer 140 can be grown for a second period of time P2 in the course of decreasing the inner temperature of the growth chamber from the first temperature Ti to a second temperature T2 at which the super lattice layer 150 or the active layer 160 are grown on the first conductive type semiconductor layer 130. In this process, supply of the sources for growth of the first conductive type semiconductor layer 130 is maintained, whereby the anti-cracking layer 140 can be grown on the first conductive type semiconductor layer 130. Thus, the anti-cracking layer 140 can be grown using the same sources as those for the first conductive type semiconductor layer 130. However, the present disclosure is not limited thereto, and for the second period of time P2, for which the anti-cracking layer 140 is grown, TEGa can be further supplied as the group III element source into the growth chamber, or can be supplied as the group III element source into the growth chamber instead of TMGa. Here, depending upon whether supply of dopant sources is stopped or not, the anti-cracking layer 140 can be doped to an n-type layer or in an undoped state. Furthermore, the anti-cracking layer 140 can be grown without supplying the sources into the growth chamber, in the course of decreasing the inner temperature of the growth chamber from the first temperature T1 to the second temperature T2. Even in the case where a separate source is not supplied into the growth chamber during the temperature decrease procedure, the anti-cracking layer 140 can be grown by the remaining sources supplied for growth of the first conductive type semiconductor layer 130.

In some exemplary embodiments, during growth of the anti-cracking layer 140, an indium (In) source can be further supplied into the growth chamber and the anti-cracking layer 140 can include AlInGaN. When the barrier layer in the active layer 160 contains indium (In), the anti-cracking layer 140 is formed to include AlInGaN and thus further improves crystal quality of the active layer 160 by relieving lattice mismatch.

The second temperature T2 can range from about 800° C. to 900° C. and may, for example, be about 840° C. In addition, the second period of time P2 can range from about 8 minutes to 15 minutes, specifically, about 10 minutes to 12 minutes. Accordingly, the anti-cracking layer 140 can be formed to a thickness of about 5 nm to 15 nm. If the second period of time P2 is too long, the anti-cracking layer 140 can become too thick, thereby deteriorating the anti-cracking function of the anti-cracking layer 140. Preferably, the second period of time P2 is adjusted such that the anti-cracking layer 140 has the above thickness. It should be understood that the present disclosure is not limited thereto.

As the inner temperature of the growth chamber is decreased from the first temperature T1 to the second temperature T2, the bowing phenomenon of the wafer including the growth substrate 110 and the nitride semiconductor layers 121, 123, 130, 140 is relieved. That is, as the inner temperature of the growth chamber is lowered for the second period of time P2, the radius of curvature of the wafer can be decreased. As shown in FIG. 10a, as compared with the degree of bowing of the wafer (as indicated by a dotted line) at the first temperature T1, the degree of bowing of the wafer can be reduced as the inner temperature of the growth chamber is decreased to the second temperature T2.

At this time, the probability that cracks are generated at an upper portion of the first conductive type semiconductor layer 130 can increase with decreasing degree of bowing of the wafer, that is, with decreasing radius of curvature of the wafer deformed into a concave shape. Specifically, as shown in FIG. 10b, some of the lattices 131 of the first conductive type semiconductor layer 130 can have a gradually increasing lattice distance in a growth direction of the first conductive type semiconductor layer 130. In a portion where the distance between the lattices 131 gradually increases in the growth direction of the first conductive type semiconductor layer 130, the lattices can be disconnected from each other and this portion has a high probability of cracking. Thus, after decrease of the inner temperature of the growth chamber to the second temperature T2, the first conductive type semiconductor layer 130 can include a crack induction portion 132. An uppermost portion of the crack induction portion 132 can have a greater horizontal lattice distance than an average horizontal lattice distance in the first conductive type semiconductor layer 130. In this exemplary embodiment, some lattices 141 in the anti-cracking layer 140 can be placed on the crack induction portion 132.

Next, referring to FIG. 11a, the anti-cracking layer 140 will be described in more detail.

As shown in FIG. 11a, the anti-cracking layer 140 includes lattice points 142, 136 placed at an interface between the anti-cracking layer 140 and the first conductive type semiconductor layer 130. Although a majority of the lattices 141 of the anti-cracking layer 140 can be connected to the lattices 131 of the first conductive type semi-conductor layer 130, some lattices 141 of the anti-cracking layer 140 are not connected to the lattices 131 of the first conductive type semiconductor layer 130. Thus, forming the anti-cracking layer 140 can include forming lattice points not connected to the lattices 131 of the first conductive type semiconductor layer 130. That is, the anti-cracking layer 140 includes first lattice points 136 that are placed at the interface 135 and are connected to the lattices 135 of the first conductive type semiconductor layer 130, and second lattice points 142 that are placed at the interface 135 and are not connected to the lattices 131 of the first conductive type semiconductor layer 130. Accordingly, at the interface 135 between the first conductive type semiconductor layer 130 and the anti-cracking layer 140, the anti-cracking layer 140 can have a higher density of lattice points per unit area than the first conductive type semiconductor layer 130. Further, a portion above the interface 135 between the first conductive type semi-conductor layer 130 and the anti-cracking layer 140 can have a higher lattice density than a portion under the interface 135.

In particular, at least some of the second lattice points 142 of the anti-cracking layer 140 can be placed on the crack induction portion 132 of the first conductive type semiconductor layer 130. As described above, as the inner temperature of the growth chamber is decreased to the second temperature T2, the distance between some lattices 141 is widened on the first conductive type semiconductor layer 130, so that the crack induction portion 132, in which the lattice distance gradually increases upwards, can be generated. In the course of decreasing the inner temperature of the growth chamber from the first temperature T1 to the second temperature T2, the second lattice points 142 can be formed on the crack induction portion 132, and the lattices 141 can be formed in the anti-cracking layer 140 so as to be connected to the second lattice points 142. That is, the anti-cracking layer 140 includes the second lattice points 142 placed at the interface 135 and not connected to the lattices of the first conductive type semi-conductor layer 130, thereby preventing generation of cracks in the first conductive type semiconductor layer 130.

Specifically, when defects occur due to separation of lattices in the crack induction portion 132 of the first conductive type semiconductor layer 130, a probability that cracks are generated in the first conductive type semiconductor layer 130 increases due to the defects. Particularly, in a post process in fabrication of the light emitting device, when the process temperature is decreased below the second temperature T2, the wafer can be deformed from a concavely bowed shape into a convexly bowed shape. In this case, the probability that cracks are generated in the first conductive type semi-conductor layer 130 increases rapidly. According to this exemplary embodiment, the anti-cracking layer 140 including the second lattice points 142 is formed on the first conductive type semiconductor layer 130, thereby allowing additional lattices to be placed on the crack induction portion of the first conductive type semiconductor layer 130. The lattices 141 connected to such second lattice points 142 can relieve stress applied to the crack induction portion 132 of the first conductive type semiconductor layer 130. Further, even when separation of the lattices occurs in the crack induction portion 132, the lattices 141 connected to the second lattice points 142 can shield defects, which are caused by separation of the lattices in the first conductive type semi-conductor layer 130, from expanding and developing into cracks or from propagating. As a result, defect and crack density of the first conductive type semiconductor layer 130 can be decreased, thereby improving crystallinity of the first conductive type semi-conductor layer 130.

Furthermore, in a UV light emitting device, which can include an Al-containing nitride semiconductor layer, an Al-containing nitride semiconductor, for example, a nitride semiconductor such as AlGaN, has a lower coefficient of thermal expansion than GaN. Accordingly, in fabrication of the UV light emitting device in which the first conductive type semiconductor layer 130 is formed of the Al-containing nitride semiconductor, the wafer can suffer from a severer bowing phenomenon than in fabrication of a blue light emitting device in which the first conductive type semiconductor layer 130 is formed of GaN. That is, upon deformation, the wafer in which the first conductive type semiconductor layer 130 is formed of AlGaN has a larger curvature than the wafer in which the first conductive type semiconductor layer 130 is formed of GaN. Accordingly, when the process applied to fabrication of a typical blue light emitting device is applied to the UV light emitting device, there is a high probability that the nitride semiconductor layers of the light emitting device will suffer from defects such as cracks. On the other hand, according to this exemplary embodiment, the anti-cracking layer 140 is formed on the first conductive type semi-conductor layer 130 to reduce the probability that cracks are generated in the first conductive type semiconductor layer 130, thereby providing a UV light emitting device in which not only the first conductive type semiconductor layer 130 but also the active layer 160 and a second conductive type semiconductor layer 170 formed in the following process have good crystallinity.

Furthermore, the anti-cracking layer 140 can be naturally formed by maintaining supply of sources to the growth chamber or by adding a specific source to the growth chamber in the course of decreasing the inner temperature of the growth chamber in order to form the super lattice layer 150 or the active layer 160 after formation of the first conductive type semiconductor layer 130. Thus, according to this exemplary embodiment, it is possible to provide a UV light emitting device including semiconductor layers having improved crystallinity while maintaining the fabrication process of a typical UV light emitting device.

According to other exemplary embodiments, the anti-cracking layer can be composed of a plurality of layers. Among the plurality of anti-cracking layers 240a to 240d, at least one layer can include lattice points not connected to lattices of other layers disposed under the at least one layer. Thus, at an interface between two layers of at least some pairs of layers continuously stacked one above another among the anti-cracking layers 240a to 240d, an upper-side anti-cracking layer can have a higher density of lattice points per unit area than a lower-side anti-cracking layer.

Specifically, referring to FIG. 11b, an anti-cracking layer 240 can include first to fourth anti-cracking layers 240a, 240b, 240c, 240d. The first anti-cracking layer 240a is placed on the first conductive type semiconductor layer 130 and can include first lattice points 136 connected to the lattices 131 of the first conductive type semi-conductor layer 130 and second lattice points 242a not connected to the lattices 131 of the first conductive type semiconductor layer 130. Thus, at an interface 135 between the first conductive type semiconductor layer 130 and the first anti-cracking layer 240a, the first anti-cracking layer 240a can have a higher density of lattice points per unit area than the first conductive type semiconductor layer 130. Particularly, at least some of the second lattice points 242a of the first anti-cracking layer 240a can be placed on the crack induction portion 132 of the first conductive type semiconductor layer 130.

Similarly, the second anti-cracking layer 240b is placed on the first anti-cracking layer 240a and can include first lattice points 246a connected to lattices 241a of the first anti-cracking layer 240a and second lattice points 242b not connected to the lattices 241a of the first anti-cracking layer 240a. Thus, at an interface between the first anti-cracking layer 240a and the second anti-cracking layer 240b, the second anti-cracking layer 240b can have a higher density of lattice points per unit area than the first anti-cracking layer 240a. This relationship can also be applied to a relationship between the second anti-cracking layer 240b and the third anti-cracking layer 240c and to a relationship between the third anti-cracking layer 240c and the fourth anti-cracking layer 240d.

In some exemplary embodiments, at an interface between two adjacent anti-cracking layers among the plurality of anti-cracking layers, an upper-side anti-cracking layer can have the same density of lattice points as a lower-side anti-cracking layer. For example, as shown in FIG. 11b, at an interface between the first anti-cracking layer 240a and the second anti-cracking layer 240b, the first anti-cracking layer 240a can have the same density of lattice points per unit area as the second anti-cracking layer 240b.

According to this exemplary embodiment, the anti-cracking layer 240 includes the plurality of anti-cracking layers 240a, 240b, 240c, 240d, thereby allowing formation of an anti-cracking layer that includes lattice points not connected to lattices of another anti-cracking layer placed at a lower side. As a result, generation of defects or cracks due to separation of lattices can be more effectively prevented.

On the other hand, the plurality of anti-cracking layers 240a, 240b, 240c, 240d can include nitride semiconductors having different composition ratios, and can be formed in a structure wherein a plurality of layers is repeatedly stacked in a certain cycle. Furthermore, the plurality of anti-cracking layers 240a, 240b, 240c, 240d can constitute a super lattice structure.

Although the anti-cracking layer 240 includes four layers in the above exemplary embodiment, it should be understood that the present disclosure is not limited thereto. The anti-cracking layer 240 can include at least two layers.

Referring to FIG. 5 again, the super lattice layer 150 can be formed on the anti-cracking layer 140. The super lattice layer 150 can have a structure wherein at least two layers are repeatedly stacked one above another. The at least two layers can include nitride semiconductors, for example, an AlGaN/GaN stack structure, an AlGaN/AlGaN stack structure, and the like. The super lattice layer 150 can be formed at the second temperature $T_2$. The super lattice layer 150 blocks defects such as dislocations or cracks from propagating from the anti-cracking layer 140 to the active layer 160, thereby preventing deterioration in crystallinity of the active layer 160. Accordingly, the UV light emitting device according to this exemplary embodiment can have improved internal quantum efficiency. In some exemplary embodiments, the super lattice layer 150 can be omitted.

Figure 6:
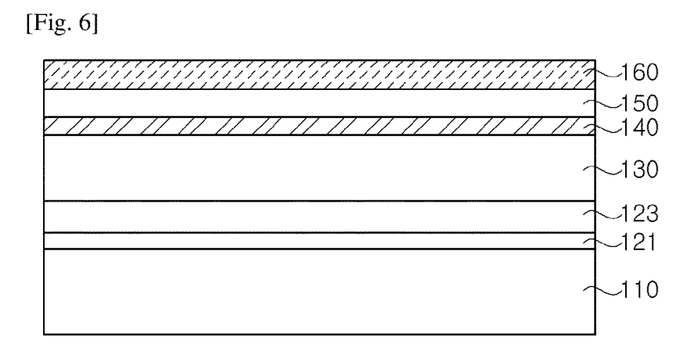

Then, referring to FIG. 6, the active layer 160 is formed on the super lattice layer 150.

The active layer 160 can include (Al, Ga, In)N and can emit light having a peak wavelength in a predetermined UV range through adjustment of a composition ratio of nitride semiconductors. The active layer 160 can include barrier layers (not shown) and well layers (not shown) alternately stacked one above another to form a multi-quantum well (MQW) structure. For example, the active layer 160 can be obtained by forming barrier layers and well layers using an Al-containing nitride semiconductor at a temperature of about 700° C. to 900° C. and a pressure of about 100 Torr to 400 Torr. Furthermore, the barrier layers and/or the well layers of the active layer 160 can contain indium (In), and can be formed of, for example, a quaternary nitride semiconductor such as AlInGaN. In the structure wherein the active layer 160 contains In, an In source can be introduced into the growth chamber during growth of the anti-cracking layer 140 such that the anti-cracking layer 140 includes In. Accordingly, lattice mismatch between the anti-cracking layer 140 and the active layer 160, particularly, between the barrier layers of the active layer 160, can be relieved, thereby improving crystallinity of the active layer 160.

In addition, among the barrier layers of the active layer 160, the nearest barrier layer to the first conductive type semiconductor layer 130 can have a higher Al content than other barrier layers. The nearest barrier layer to the first conductive type semi-conductor layer 130 is formed to have a greater band gap than the other barrier layers, whereby overflow of electrons can be effectively prevented through decrease in movement speed of the electrons.

Figure 7:
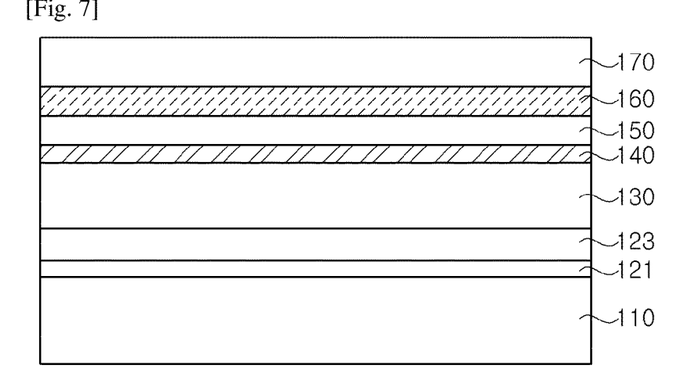

Next, referring to FIG. 7, a second conductive type semiconductor layer 170 is formed on the active layer 160. As a result, a light emitting device as shown in FIG. 7 can be provided.

The second conductive type semiconductor layer 170 can be formed on the active layer 160, and can be formed to a thickness of about 0.2 μm or less by supplying an Al-containing group III element source, an N source and a dopant source into a chamber at a temperature of about 900° C. to 1000° C. and a pressure of about 100 Torr to 400 Torr. The second conductive type semiconductor layer 170 can include a nitride semi-conductor such as AlGaN or GaN, and can further include a dopant, such as Mg, with which a p-type layer is formed.

Furthermore, the second conductive type semiconductor layer 170 can further include a delta-doping layer (not show) to reduce ohmic contact resistance, and can further include an electron-blocking layer (not shown). The electron-blocking layer can include an AlGaN layer. Further, the electron-blocking layer can include a first electron-blocking layer (not shown) and a second electron-blocking layer (not shown) placed on the first electron-blocking layer, wherein the first electron-blocking layer can have a higher Al content than the second electron-blocking layer.

In some embodiments, the first conductive type semiconductor layer 130, the active layer 140 and the second conductive type semiconductor layer 150 can further include additional layers. For example, the semiconductor layers 130, 140, 150 can further include a super lattice layer, a high density doped layer, and the like, thereby improving crystallinity and luminous efficacy of the light emitting device.

The light emitting device of FIG. 7 can be fabricated to have various structures through additional processes. Hereinafter, the structure of the UV light emitting device will be described through exemplary embodiments with reference to FIG. 12 to FIG. 16. However, it should be understood that the present disclosure is not limited to the following exemplary embodiments.

Figure 12:
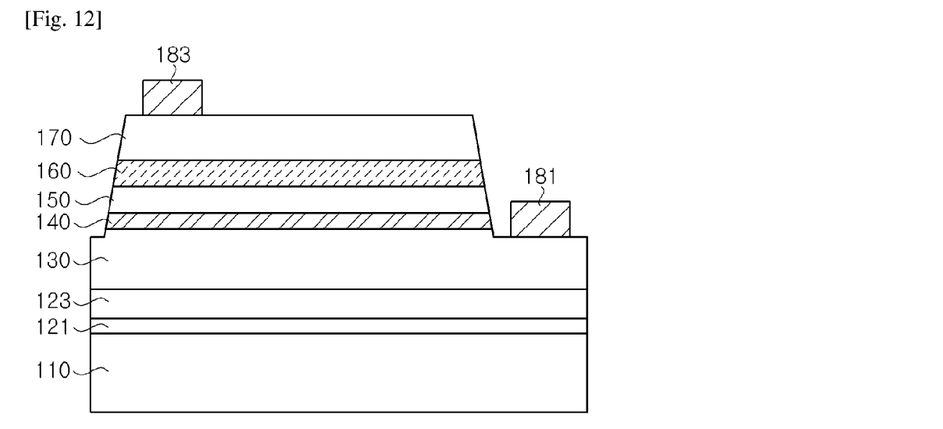
FIG. 12 is a sectional view of a UV light emitting device according to other exemplary embodiments and a method of fabricating the same.

First, FIG. 12 is a sectional view of a UV light emitting device according to exemplary embodiments and a method of fabricating the same.

Referring to FIG. 12, the UV light emitting device includes a growth substrate 110, a first conductive type semiconductor layer 130, an anti-cracking layer 140, an active layer 160, a second conductive type semiconductor layer 170, a first electrode 181, and a second electrode 183. The UV light emitting device can further include a buffer layer 121, a base nitride layer 123, and a super lattice layer 150.

The UV light emitting device of FIG. 12 can be fabricated from the UV light emitting device of FIG. 7. From the UV light emitting device of FIG. 7, the second conductive type semiconductor layer 170, the active layer 160 and the super lattice layer 150 are partially removed such that the first conductive type semiconductor layer 130 is partially exposed, and the first and second electrodes 181, 183 are formed on the first conductive type semiconductor layer 130 and the second conductive type semi-conductor layer 170, respectively. As a result, a horizontal type UV light emitting device as shown in FIG. 12 can be provided.

FIG. 13 to FIG. 16 are sectional views of a UV light emitting device according to a further exemplary embodiment and a method of fabricating the same. The UV light emitting device shown in FIG. 13 to FIG. 16 can be fabricated from the UV light emitting device of FIG. 7. Hereinafter, a method of fabricating the UV light emitting device according to this exemplary embodiment will be described.

Figure 13:
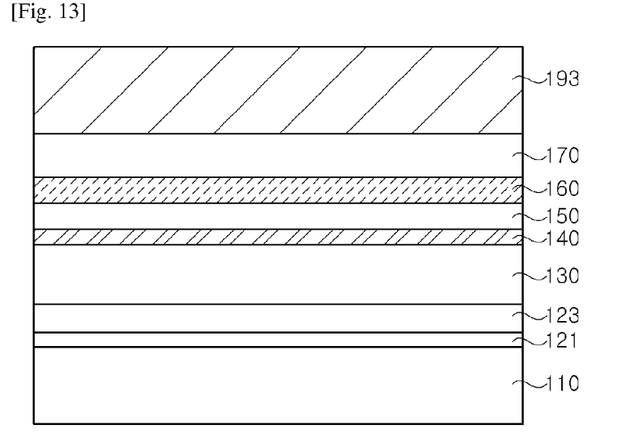
FIG. 13 to FIG. 16 are sectional views of a UV light emitting device according to further exemplary embodiments and a method of fabricating the same.

Referring to FIG. 13, a support substrate 193 is formed on the second conductive type semiconductor layer 170.

The support substrate 193 can be an insulation substrate, a conductive substrate, or a circuit board. For example, the support substrate 193 can be a sapphire substrate, a gallium nitride substrate, a glass substrate, a silicon carbide substrate, a silicon substrate, a metal substrate, a ceramic substrate, and the like. In addition, the support substrate 193 can be formed on the second conductive type semiconductor layer 170 via bonding, whereby a bonding layer (not shown) can be further formed between the support substrate 193 and the second conductive type semiconductor layer 170 to bond the support substrate 193 and the second conductive type semiconductor layer 170 to each other.

The bonding layer can include a metallic material, for example, AuSn. The bonding layer including AuSn provides eutectic bonding between the support substrate 193 and the second conductive type semiconductor layer 170. In the structure wherein the support substrate 193 is a conductive substrate, the bonding layer electrically connects the second conductive type semiconductor layer 170 to the support substrate 193.

Furthermore, a reflective layer (not shown) can be further formed between the support substrate 193 and the second conductive type semiconductor layer 170. The reflective layer can include a reflective metal layer (not shown) and a barrier metal layer (not shown), which can be formed to cover the reflective metal layer.

The reflective metal layer can be formed by deposition. The reflective metal layer can serve to reflect light and can act as an electrode electrically connected to the second conductive type semiconductor layer 170. Thus, it is desirable that the reflective metal layer include a material capable of forming ohmic contact while exhibiting high reflectivity with respect to UV light. The reflective metal layer can include at least one metal of, for example, Ni, Mg, Pt, Pd, Rh, W, Ti, Al, Ag, and Au. On the other hand, the barrier layer prevents inter-diffusion between the reflective metal layer and other materials. Accordingly, it is possible to prevent increase in contact resistance and decrease in reflectivity due to damage to the reflective metal layer. The barrier layer can include Ni, Cr, Ti, W, Pt, and the like, and can be composed of multiple layers.

Alternatively, a transparent electrode can be further formed between the support substrate 193 and the second conductive type semiconductor layer 170, and can include at least one of conductive oxides such as ITO, IZO and AZO, and a metallic material such as Ni/Au.

Figure 14:
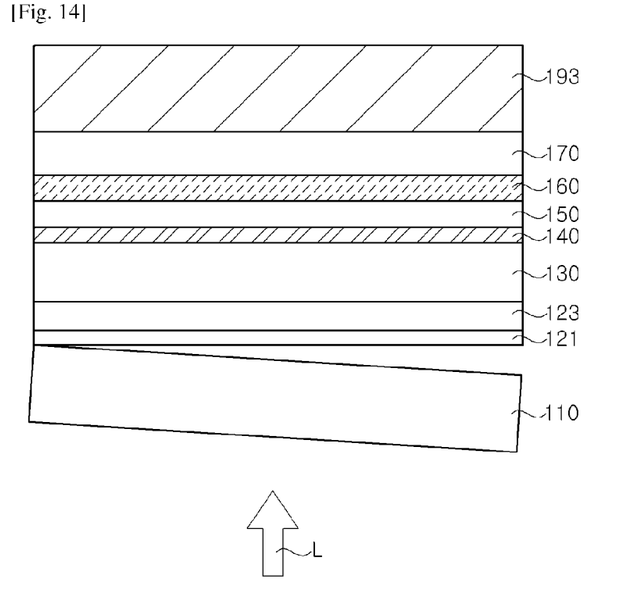

Referring to FIG. 14, the growth substrate 110 is separated from the first conductive type semiconductor layer 130. Particularly, the growth substrate 110 can be separated from the base nitride layer 123 or the buffer layer 121.

Separation of the growth substrate 110 from the first conductive type semiconductor layer 130 can be realized by laser lift-off. As shown in FIG. 14, the base nitride layer 123 can be decomposed by irradiating the base nitride layer 123 with a laser beam (L) in a direction from the growth substrate 110 to the first conductive type semiconductor layer 130, followed by separating the growth substrate 110 from the first conductive type semiconductor layer 130. Here, the growth substrate 110 can be a sapphire substrate and the base nitride layer 123 can include GaN or AlGaN.

According to this exemplary embodiment, the base nitride layer 123 including GaN or AlGaN can be interposed between the first conductive type semiconductor layer 130 and the growth substrate 110, thereby allowing easy separation of the growth substrate 110 even using a KrF excimer laser. Accordingly, it is possible to solve difficulty in separation of the growth substrate through laser lift off in fabrication of a typical UV light emitting device.

Further, the UV light emitting device, which includes the buffer layer 121 including GaN and the base nitride layer 123 including GaN or AlGaN having a relatively higher composition ratio of Ga, has a higher probability of generating cracks in the first conductive type semiconductor layer 130 than a UV light emitting device including an AlN buffer layer. That is, in the structure wherein a nitride semiconductor layer having a relatively higher composition ratio of Ga is formed between the sapphire substrate and the first conductive type semiconductor layer 130, the probability that cracks occur due to stress applied to the first conductive type semiconductor layer 130 is further increased. Accordingly, conventionally, it is difficult to form the buffer layer 121 including GaN and the base nitride layer 123 including GaN or AlGaN having a relatively higher composition ratio of Ga between the growth substrate 110 and the first conductive type semiconductor layer 130 to prevent generation of cracks in the first conductive type semiconductor layer 130.

However, according to the exemplary embodiment, since the anti-cracking layer 140 is formed, it is possible to prevent generation of cracks in the first conductive type semiconductor layer 130 even when the buffer layer 121 including GaN and the base nitride layer 123 including GaN or AlGaN having a relatively higher composition ratio of Ga are formed before formation of the first conductive type semiconductor layer 130. Accordingly, a laser lift-off process can be applied to the process of separating the growth substrate 110 in fabrication of a vertical type light emitting device or a flip-chip type light emitting device from which the growth substrate 110 is separated. Accordingly, the exemplary embodiments of the present disclosure provide a method of fabricating a UV light emitting device, which allows easy separation of the growth substrate 110, and a UV light emitting device fabricated by the same.

However, the present disclosure is not limited thereto, and additional layers (for example, a sacrificial layer) can be further formed between the growth substrate 110 and the semiconductor layers such that the growth substrate 110 can be separated by chemical lift-off, stress lift-off or thermal lift-off. Alternatively, the growth substrate 110 can be removed by a physical/chemical process such as grinding and lapping.

Figure 15:
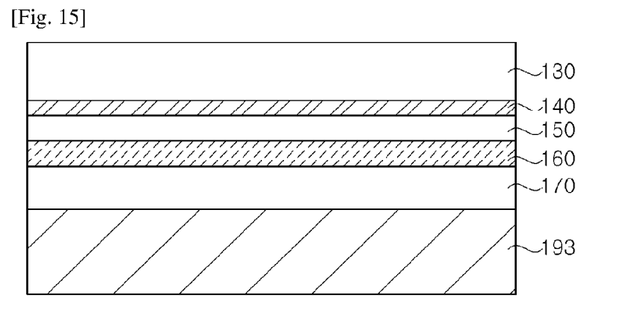

Referring to FIG. 15, after separation of the growth substrate 110, other remaining semiconductor layers (for example, remaining materials on the base nitride layer 123 and/or the buffer layer 121) on the first conductive type semiconductor layer 130 can be removed to expose one surface of the first conductive type semiconductor layer 130. The remaining layers placed on the first conductive type semiconductor layer 130 can be removed by chemical and/or physical methods, or etching, for example, at least one process selected from CMP, lapping, wet etching, and dry etching.

Figure 16:
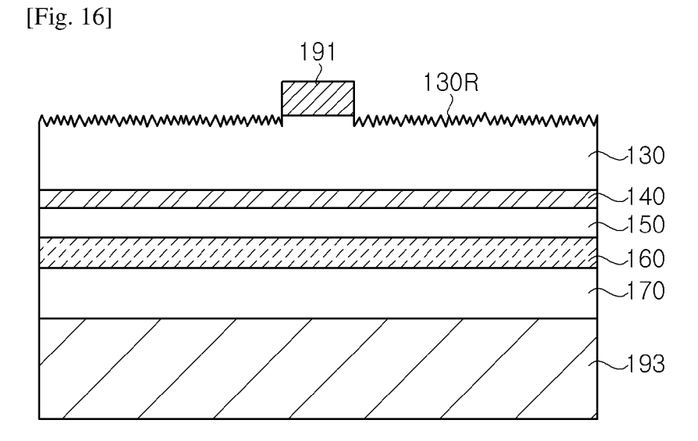

Referring to FIG. 16, a first electrode 191 is formed on the first conductive type semiconductor layer 130, thereby providing a vertical UV light emitting device, as shown in FIG. 16. In some exemplary embodiments, before or after formation of the first electrode 191, a roughness 130R can be further formed on the first conductive type semiconductor layer 130 by increasing surface roughness thereof.

Increasing the surface roughness of the first conductive type semiconductor layer 130 can be performed using dry etching, wet etching, and electrochemical etching, for example, PEC (photo-enhanced chemical) etching, etching using a sulfuric-phosphoric acid solution, or etching using a hydroxide solution (for example, KOH, NaOH). The roughness varies depending upon etching conditions, and can have an average height of, for example, 1.5 μm or less. The roughness can improve light extraction efficiency of the UV light emitting device according to the exemplary embodiments.

In other exemplary embodiments, increasing the surface roughness of the first conductive type semiconductor layer 130 can be performed before or after formation of the first electrode 191. In addition, the roughness 130R cannot be formed in a region of the first electrode 191 on the surface of the first conductive type semiconductor layer 130. However, the present disclosure is not limited thereto, and the roughness 130R can be selectively formed in the region of the first electrode 191 by taking into account contact resistance between the first electrode 191 and the first conductive type semi-conductor layer 130.

The first electrode 191 can be formed on the first conductive type semiconductor layer 130 by deposition and lift-off, and can be composed of a single layer or multiple layers. The first electrode 191 can include a metal such as Ti, Pt, Au, Cr, Ni, and Al, and can form ohmic contact with the first conductive type semiconductor layer 130.

Although the vertical type light emitting device having the growth substrate 110 removed therefrom has been described in the above exemplary embodiments described with reference to the accompanying drawings, it should be understood that the present disclosure is not limited thereto. The fabrication method according to the exemplary embodiments can also be applied to a flip-chip type light emitting device from which the growth substrate 110 is removed.

Although some exemplary embodiments have been described herein, it should be understood that these embodiments are given by way of illustration only, and that various modifications, variations and alterations can be made by those skilled in the art without departing from the spirit and scope of the invention.

The invention claimed is:

1. A UV light emitting device comprising:
a first conductive type semiconductor layer;
an anti-cracking layer disposed directly contacting and above the first conductive type semiconductor layer;
an active layer disposed directly contacting and above the anti-cracking layer; and
a second conductive type semiconductor layer disposed directly contacting and above the active layer,
wherein the anti-cracking layer includes first lattice points and second lattice points that are disposed at an interface between the first conductive type semiconductor layer and the anti- cracking layer, and
the first lattice points are connected to lattices of the first conductive type semiconductor layer, and the second lattice points are not connected to the lattices of the first conductive type semiconductor layer.

2. The UV light emitting device of claim 1, wherein, at the interface between the first conductive type semiconductor layer and the anti-cracking layer, the anti-cracking layer has a higher density of lattice points per unit area than the first conductive type semiconductor layer.

3. The UV light emitting device of claim 1, wherein the first conductive type semiconductor layer includes a crack induction portion in which a lattice distance gradually increases in an upward direction.

4. The UV light emitting device of claim 3, wherein a horizontal lattice distance in an uppermost portion of the crack induction portion is greater than an average horizontal lattice distance in the first conductive type semiconductor layer.

5. The UV light emitting device of claim 3, wherein at least some of the second lattice points are positioned on the crack induction portion.

6. The UV light emitting device of claim 1, wherein the anti-cracking layer includes a first layer and a second layer formed under the first layer, wherein the first layer includes a lattice point not connected to any lattices of the second layer at an interface between the first layer and the second layer.

7. The UV light emitting device of claim 6, wherein the anti-cracking layer has a super lattice structure.

8. The UV light emitting device of claim 1, wherein each of the first conductive type semiconductor layer and the anti-cracking layer includes a nitride-based semiconductor including one of Al and Ga.

9. The UV light emitting device of claim 8, wherein the anti-cracking layer further includes indium (In), the active layer has a multi-quantum well structure including barrier layers and well layers, and the barrier layer includes a nitride-based semiconductor including Al, Ga and In.

10. The UV light emitting device of claim 1, further including:
   a growth substrate disposed under the first conductive type semiconductor layer,
   wherein the growth substrate has a higher coefficient of thermal expansion than the first conductive type semiconductor layer.

11. The UV light emitting device of claim 1, further including:
   a super lattice layer interposed between the anti-cracking layer and the active layer.

12. The UV light emitting device of claim 1, further including:
   a first electrode disposed under the first conductive type semiconductor layer and electrically connected to the first conductive type semiconductor layer; and
   a second electrode disposed on an upper side of the second conductive type semiconductor layer and electrically connected to the second conductive type semiconductor layer.

13. The UV light emitting device of claim 1, wherein the anti-cracking layer has a thickness of 5 nm to 15 nm.

* * * * *